(12) United States Patent
Huang (10) Patent No.: US 8,924,450 B2
(45) Date of Patent: Dec. 30, 2014

(54) TIME-DIVISION DECIMATION FILTER BANK AND TIME-DIVISION DECIMATION FILTERING METHOD

(75) Inventor: Kung-Piao Huang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 937 days.

(21) Appl. No.: 13/028,191

(22) Filed: Feb. 15, 2011

(65) Prior Publication Data

US 2011/0231466 A1 Sep. 22, 2011

(30) Foreign Application Priority Data

Mar. 17, 2010 (TW) ................................ 99107848 A (51) Int. Cl.
*G06F 17/10* (2006.01)
*H03H 17/02* (2006.01)
*H03H 17/06* (2006.01)

(52) U.S. Cl.
CPC ....... *H03H 17/0292* (2013.01); *H03H 17/0664* (2013.01); *H03H 2218/04* (2013.01); *H03H 2220/04* (2013.01)
USPC .......................................................... 708/313

(58) Field of Classification Search
CPC .......................... H03H 17/045; H03H 17/0664
USPC .......................................................... 708/313
See application file for complete search history.

(56) References Cited

U.S. PATENT DOCUMENTS

| | | | |
|---|---|---|---|
| 5,157,395 A * | 10/1992 | Del Signore et al. | 341/143 |
| 5,493,581 A | 2/1996 | Young et al. | |
| 5,515,402 A | 5/1996 | Chester | |
| 5,617,344 A | 4/1997 | Young et al. | |
| 5,633,815 A | 5/1997 | Young | |
| 5,872,480 A * | 2/1999 | Huang | 329/304 |
| 6,470,365 B1 * | 10/2002 | Rahman et al. | 708/313 |
| 6,532,273 B1 | 3/2003 | Mobin et al. | |
| 2006/0049969 A1 * | 3/2006 | Lee | 341/118 |
| 2008/0152050 A1 | 6/2008 | Watanabe | |

FOREIGN PATENT DOCUMENTS

| | | |
|---|---|---|
| CN | 1442986 | 9/2003 |
| CN | 101674067 | 3/2010 |
| CN | 101682297 | 3/2010 |

OTHER PUBLICATIONS

"First Office Action of China Counterpart Application", issued on Apr. 25, 2013, p. 1-p. 6.

(Continued)

*Primary Examiner* — Chuong D Ngo
(74) *Attorney, Agent, or Firm* — Jianq Chyun IP Office (57) ABSTRACT

A time-division (TD) decimation filter bank includes two decimation filter units. The first decimation filter unit operates at a system clock and receives a first-stage input data string. Each data in the first-stage input data string has a first part data and second part data. During the odd clock periods, the first part data are filtered and decimated in frequency. During the even clock periods, the second part data are filtered and decimated in frequency. The second decimation filter unit operates at the system clock and $2^N$ clock periods are set as an operation-period unit, $N \geq 2$. The second decimation filter unit receives the outputs from the first decimation filter unit and receives several feedback data of the second decimation filter unit by TD, so that the received data are distributed into the $2^N$ clock periods for filtering and decimation and outputting by TD.

9 Claims, 12 Drawing Sheets

(56) References Cited

OTHER PUBLICATIONS

Brandt et al, "A low-power, area-efficient digital filter for decimation and interpolation", Solid-State Circuits, IEEE Journal of, Jun. 1994, pp. 679-pp. 687, vol. 29, No. 6.

"Office Action of Taiwan Counterpart Application", issued on Mar. 4, 2014, p. 1-p. 8.

"Office Action of Taiwan Counterpart Application", issued on Sep. 22, 2014, pp. 1-5.

* cited by examiner

TIME-DIVISION DECIMATION FILTER BANK AND TIME-DIVISION DECIMATION FILTERING METHOD

CROSS-REFERENCE TO RELATED APPLICATION

This application claims the priority benefit of Taiwan application serial no. 99107848, filed on Mar. 17, 2010. The entirety of the above-mentioned patent application is hereby incorporated by reference herein and made a part of this specification.

BACKGROUND OF THE INVENTION

1. Field of the Invention

The present invention relates to a time-division decimation filter bank, in which filtering and decimation operations of a decimation filter unit can be performed by time-division.

2. Description of Related Art

During signal transmission, some signals are converted into a digital format for transmission by using high-density sampling points. However, at a receiving end, the signal has to be first filtered and decimated in frequency, and then the transmitted data is obtained. Generally, the frequency decimation has four stages, i.e. a 16-fold decimation is performed.

Figure 1:
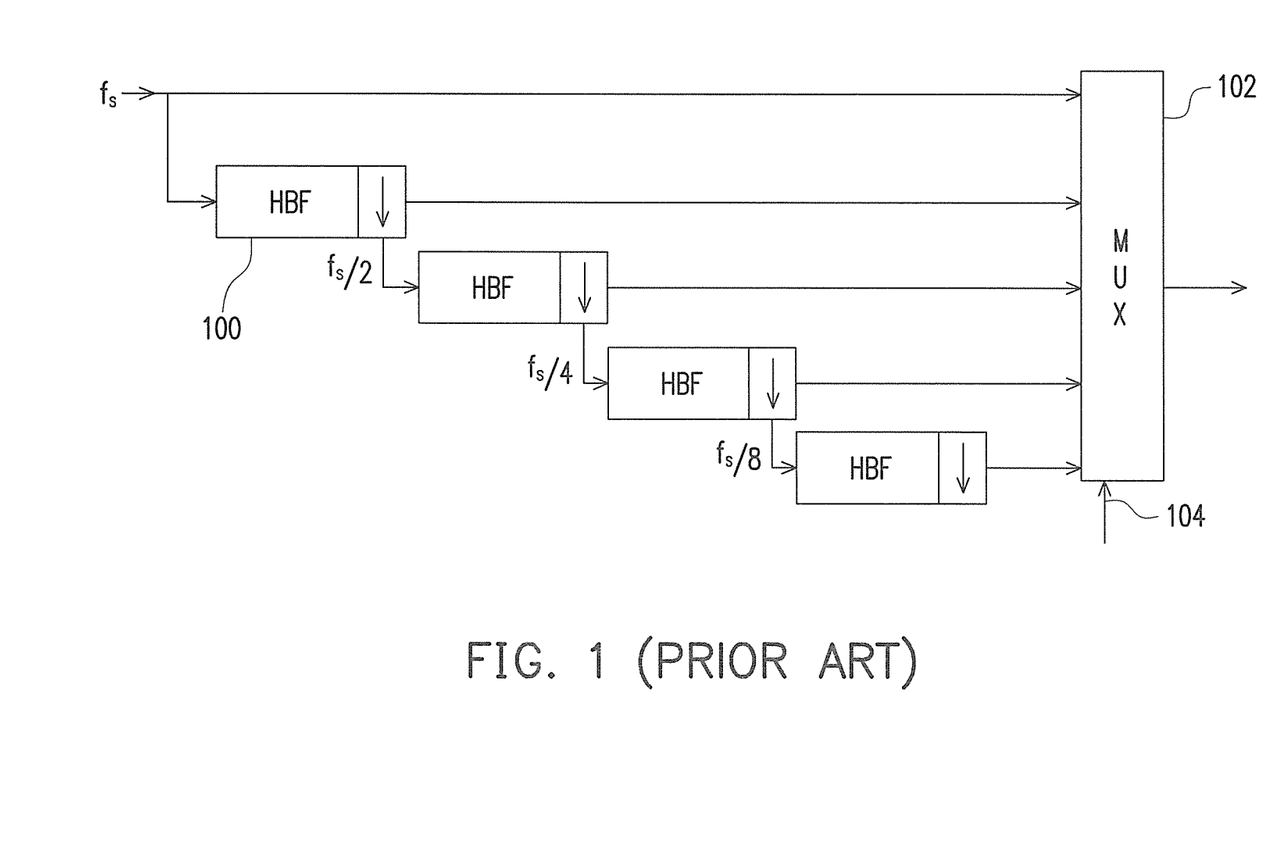
FIG. 1 is a schematic diagram illustrating a conventional filter and decimation structure.

FIG. 1 is a schematic diagram illustrating a conventional filter and decimation structure. Referring to FIG. 1, in view of a frequency domain, an input signal is input with a frequency of fs, and is decimated in frequency for four stages through four decimation filter units 100, and a frequency of an output signal is fs/16. The decimation filter unit 100, for example, includes of a half band filter (HBF) and a decimator. The decimator is represented by a downward arrow. In other words, each of the decimation filter units 100 performs a decimation sampling of fs/2, so that the four decimation filter units 100 can totally reach a decimation sampling of fs/16. Regarding an output, the decimation filter unit 100 of each stage can provide an input of the decimation filter unit 100 of a next stage, and can simultaneously provide the output to a time-division multiplexer (MUX) 102, and then an output data is selected by time-division according to a control signal 104.

Regarding an actual data, for example, during a satellite communication, one data consists of a real part data and an imaginary part data, which are respectively referred to as I data and Q data. According to the conventional structure of FIG. 1, 16 decimation and filter units 100 are required to reach a 4-fold decimation of the I data and the Q data, which may lead to a high cost.

To achieve an effective filtering and decimation design is one of major research and development directions.

SUMMARY OF THE INVENTION

The present invention is directed to a time-division (TD) decimation filter bank, which can effectively use an idle time of a conventional technique to reduce a usage amount of decimation and filter units through a pipeline mechanism.

The present invention provides a time-division (TD) decimation filter bank including a half decimation filter unit. The half decimation filter unit operates at a system clock, and receives an input data string. Each data in the input data string has a first part data and a second part data. During each odd clock period of the system clock, the first part data is filtered and decimated by half in frequency for outputting. During each even clock period, the second part data is filtered and decimated by half in frequency for outputting.

The present invention provides a time-division (TD) decimation filter bank including a half decimation filter unit. The half decimation filter unit operates at a system clock to receive an input data string. $2^N$ clock periods are taken as an operation-period unit, wherein $N \geq 2$. The half decimation filter unit receives the input data string and receives a plurality of feedback data of the half decimation filter unit by TD, so as to distribute the received data into the $2^N$ clock periods for filtering and decimation and outputting by TD.

The present invention provides a time-division (TD) decimation filter bank including a first decimation filter unit and a second decimation filter unit. The first decimation filter unit operates at a system clock and receives a first-stage input data string. Each data in the first-stage input data string has a first part data and second part data. During odd clock periods, the first part data are filtered and decimated for outputting. During even clock periods, the second part data are filtered and decimated for outputting. The second decimation filter unit operates at the system clock, and $2^N$ clock periods are taken as an operation-period unit, wherein $N \geq 2$. The second decimation filter unit receives an output of the first decimation filter unit and receives a plurality of feedback data of the second decimation filter unit by TD, so as to distribute the received data into the $2^N$ clock periods for filtering and decimation and outputting by TD.

The present invention provides a time-division (TD) decimation filtering method. According to the method, a first half decimation filter unit operated under a system clock is used for receiving a first-stage input data string, wherein each data in the first-stage input data string includes a first part data and second part data, during each odd clock period of the system clock, the first part data is filtered and decimated by half in frequency for outputting, and during each even clock period, the second part data is filtered and decimated by half in frequency for outputting. A second half decimation filter unit is operated under the system clock, and $2^N$ clock periods are taken as an operation-period unit, wherein $N > 2$, and the second half decimation filter unit receives an output of the first half decimation filter unit and receives a plurality of feedback data of the second half decimation filter unit by TD, so as to distribute the received data into the $2^N$ clock periods for filtering and decimation and outputting by TD.

The present invention provides a time-division (TD) decimation filter bank including a half decimation filter unit. The half decimation filter unit operates at a system clock and $2^4$ clock periods are set as an operation-period unit, wherein the half decimation filter unit receives an input data string and receives a plurality of feedback data of the half decimation filter unit by TD, so as to distribute the received data into the $2^4$ clock periods for filtering and decimation and outputting by TD.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The present invention provides a design for effectively making use of decimation filter units, which can reduce a quantity of the utilized decimation filter units. For example, two decimation filter units can be used to achieve a 16-fold decimation effect that is originally achieved via eight decimation filter units in a conventional technique.

A plurality of embodiments is provided below for describing the present invention, though the present invention is not limited to the provided embodiments, and the provided embodiments can also be suitably combined.

Figure 2:
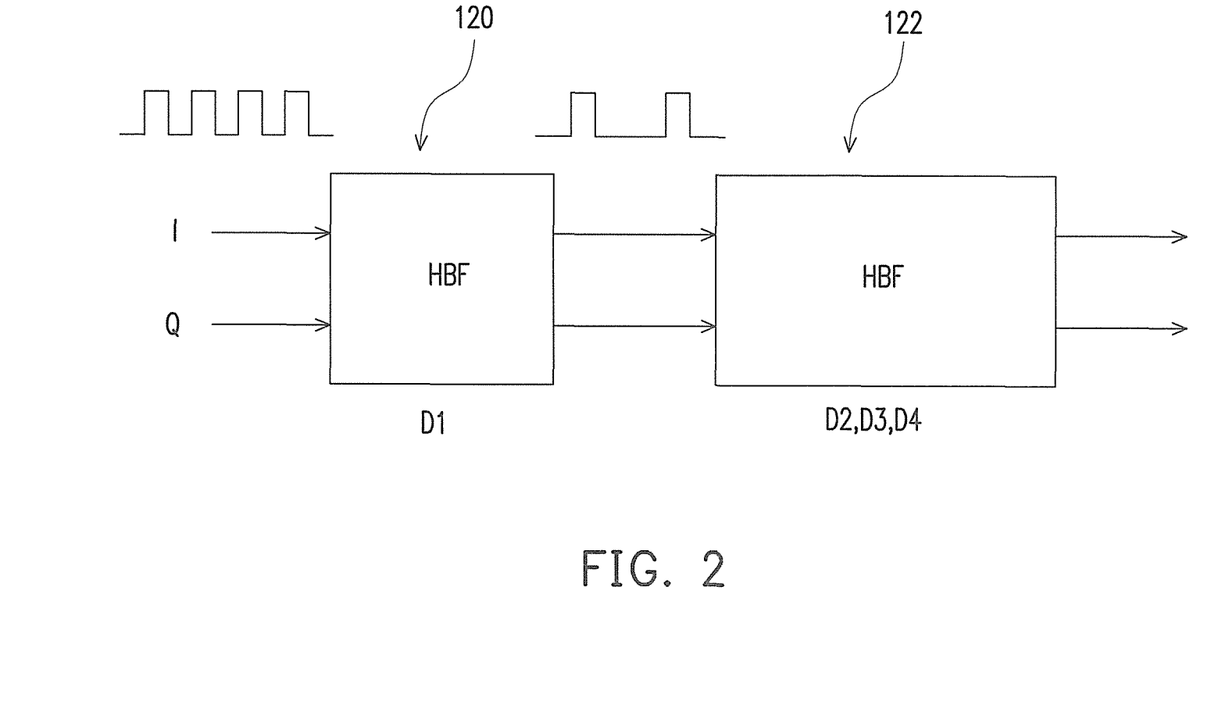
FIG. 2 is a circuit block diagram illustrating a time-division (TD) decimation filter bank according to an embodiment of the present invention.
Figure 3:
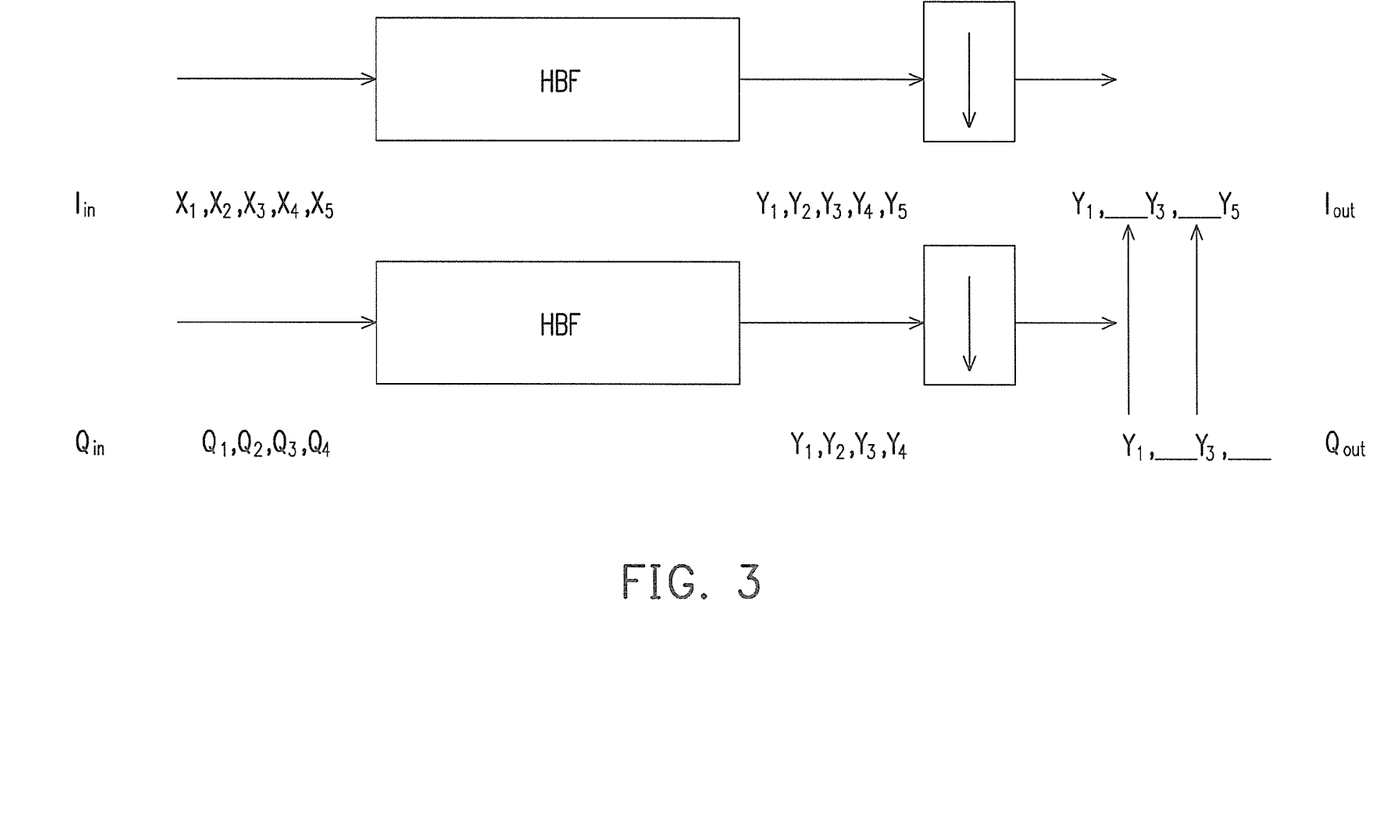
FIGS. 3-5 are schematic diagrams illustrating an operation mechanism of a half decimation filter unit 120 of FIG. 2.

Regarding a four-stage 16-fold decimation operation, in an embodiment of the present invention, two decimation filter units can be used to achieve the 16-fold decimation of a real part data and an imaginary part data. FIG. 2 is a circuit block diagram illustrating a time-division (TD) decimation filter bank according to an embodiment of the present invention. The TD decimation filter bank includes two half decimation filter units 120 and 122. A circuit structure of the decimation filter unit is described in detail later. The half decimation filter unit 120 operates at a system clock, and receives an input data string. Each data in the input data string has a first part data and second part data, wherein the first part data is, for example, the real part data, which is represented by I, and the second part data is, for example, the imaginary part data, which is represented by Q. The real part data and the imaginary part data form a complex data. As shown in FIG. 3, during each odd clock period of the system clock, the first part data is filtered and decimated by half in frequency for outputting, and during each even clock period, the second part data is filtered and decimated by half in frequency for outputting. Therefore, the half decimation filter unit 120 decimates and filters both of the real part data and the imaginary part data of the input data string, and outputs a result to the half decimation filter unit 122. An output frequency of the half decimation filter unit 120 is decimated by half. Namely, the half decimation filter unit 120 performs a first stage decimation and filtering operation (D1) to both of the real part data and the imaginary part data.

In the present invention, the half decimation filter unit 122 also operates at the system clock, and takes $2^N$ clock periods as an operation-period unit, wherein N≥2, and in the present embodiment, N=4 is taken as an example. The half decimation filter unit 122 receives a data output of the half decimation filter unit 120, and receives a plurality of feedback data of the half decimation filter unit 122 itself by TD, so as to distribute the received data into the $2^N$ clock periods for filtering and decimation and outputting by TD. Namely, regarding the four-stage operations, the half decimation filter unit 122 performs a second stage to a fourth stage decimation and filtering operations (D2-D4) to a feedback cycle of the real part data and the imaginary part data. In this way, the 16-fold decimation can be achieved by using only two half decimation filter units 120 and 122.

FIG. 3 is a schematic diagram illustrating an operation mechanism of the half decimation filter unit to be simplified in the invention. Referring to FIG. 3, the invention investigates the conventional manner for have the decimation in frequency for the real part and the imaginary part, which are respectively performed in decimation by using two half decimation filter units. The input data string includes a real part input data string containing X1, X2, X3, X4, X5, . . . , and an imaginary part input data string $Q_{in}$ containing Q1, Q2, Q3, Q4, Q5, . . . . Each part are separately filtered by HBF and then is dropped by a decimator. In the present embodiment, the real part data is, for example, first processed, though the imaginary part data can also be first processed according to a same manner, which is determined according to an actual need.

According to a time relationship of the real part input data string $I_{in}$, the real part input data string $I_{in}$ is filtered by the HBF to obtain Y1, Y2, Y3, Y4, Y5, . . . . Then, the even data Y2, Y4, . . . in the filtered data are abandoned to achieve the half decimation effect. In other words, time spent for processing the even data Y2, Y4, . . . is actually unnecessary, and the corresponding data are abandoned. The imaginary part data is decimated according to the same approach as that of the real part data.

Since the imaginary part data and the real part data are all decimated by half in frequency through the decimator, in consideration of the invention, the data string of imaginary part is delayed to the timing for the even data Y2, Y4 of the real part to perform the filtering operation on the imaginary data, instead, and then the output manner is changed by outputting the real art and the imaginary part in alternative sequence. In addition, it needs no the decimator for underclocking because the underclocking effect has been down while the real part and the imaginary part are alternative in filtering operation.

Figure 4:
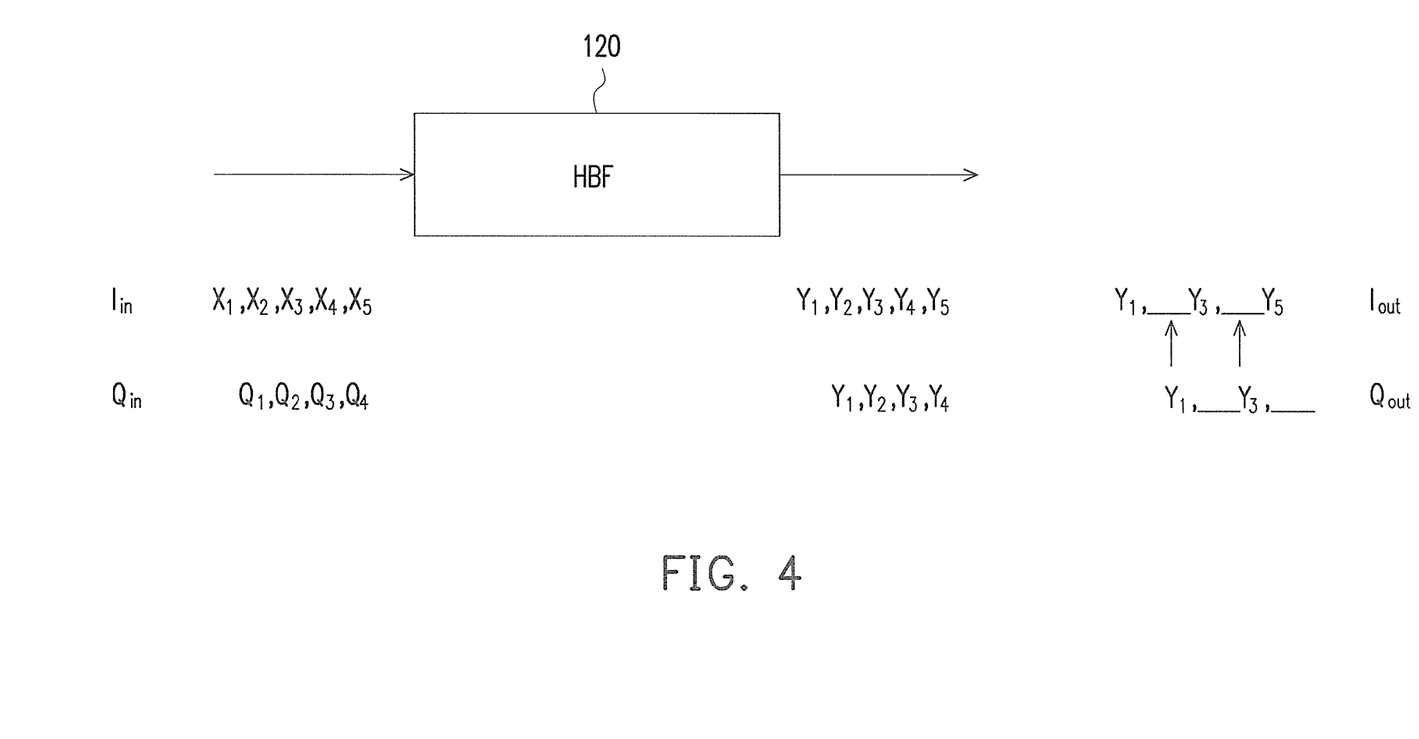

FIG. 4 is an operation mechanism of the decimation filter unit 120, according to an embodiment of the invention. Based on the mechanism in FIG. 3, the decimation filter unit 120 in FIG. 4 does not need to decimate data but the sequence of the input data are adjusted and then the output sequence is accordingly set. In the present embodiment for the first stage decimation filter unit 120, when the real part data is processed, the imaginary part input data string $Q_{in}$ is suitabled delayed in collaboration with the corresponding clock periods of the abandoned data of the real part data, and is input to the same decimation filter unit 120. In this way, the odd data Y1, Y3, . . . to be retained in the imaginary part input data string $Q_{in}$ correspond to the abandoned even data Y2, Y4, . . . of the real part input data string $I_{in}$. Therefore, the odd data Y1, Y3, Y5, . . . of a real part output data string $I_{out}$ output by the decimation filter unit 120 are half decimation data relative to the system clock. Moreover, the odd data Y1, Y3, . . . of an imaginary part output data string $Q_{out}$ output by the decimation filter unit 120 are also half decimation data relative to the system clock, though the imaginary part output data string $Q_{out}$ is delayed for one clock period relative to the real part output data string $I_{out}$. In this way, the first stage half decimation filter unit 120 can simultanously process the real part data and the imaginary part data without using two half decimation filter units 120 to respectivley process the real part data and the imaginary part data.

Figure 5:
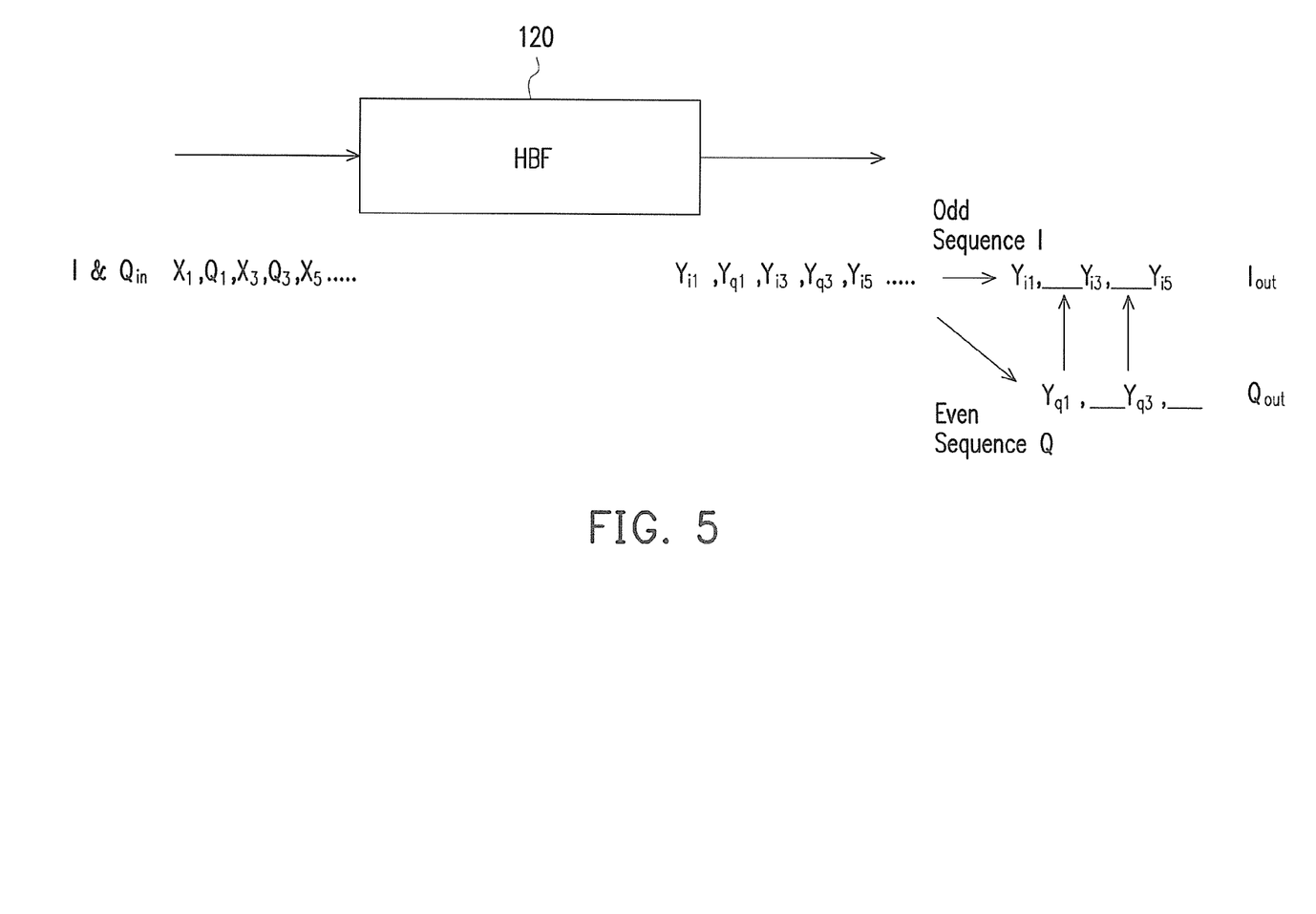

FIG. 5 schematically illustrating the operation mechanism of input and output for the decimation filter units, according to an embodiment of the invention. In FIG. 5, the way to input the real part and the imaginary part is setting the imaginary part data Q1, Q3, . . . to correspond to the real part data X2, X4, . . . , which are belonging to the data to be decimated when decimation in frequency. At the data output terminal, there is no need a decimator, which is needed in conventional way, to decimate in frequency. Instead, the data in sequence are recognized by treating the odd data output as the real part data I and the even data output as the imaginary part data Q.

An operation mechanism of the half decimation filter unit 122 of FIG. 2 is described below. In the half decimation filter unit 122 for the second stage, since operation of the decimation in frequency can release more free time to be used, it allows the subsequent three stages of decimation to be integrated into as single half decimation filter unit 122 for operation. With the same principle, the data are input by a cycling sequence, and the output data is selected according a rule to correspond to the output data from each stage of decimation in frequency.

Figure 6:
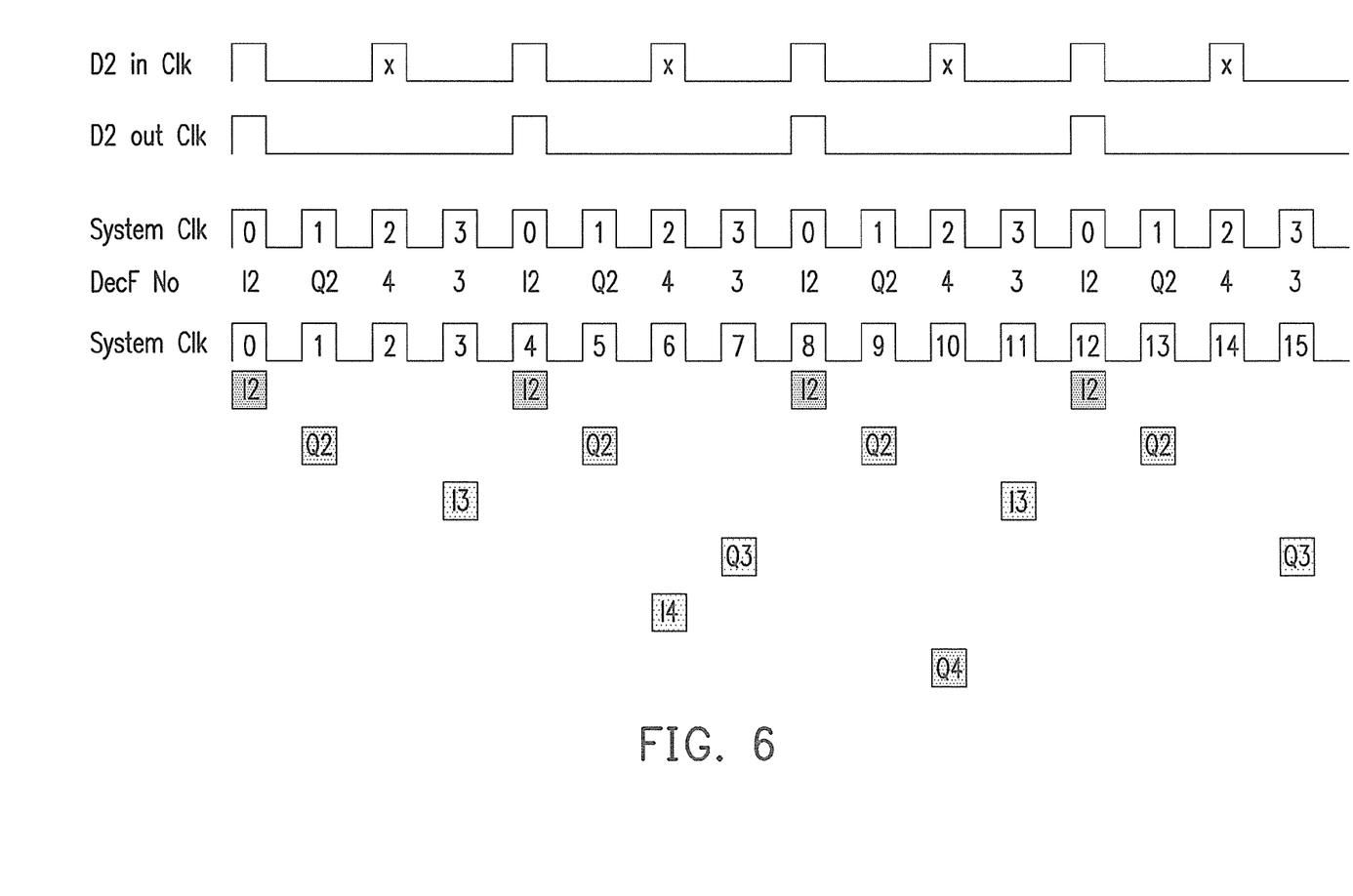
FIG. 6 is a schematic diagram illustrating an operation timing of a half decimation filter unit 122 according to an embodiment of the present invention.

FIG. 6 is a schematic diagram illustrating an operation timing of the half decimation filter unit 122 according to an embodiment of the present invention. Referring to FIG. 4, since the first stage half decimation filter unit 120 has performed the half decimation operation, a clock input to the half decimation filter unit 122 is represented by D2 in Clk, and a frequency thereof is decimated by half relative to the system clock (System Clk). An output clock is represented by D2 out Clk, and is further decimated by half in frequency, wherein data belonged to the clock periods marked by x are abandoned. In other words, regarding the second stage decimation, the output period is $2^2$ clock periods. According to the aforementioned mechanism, regarding the decimation operation of the D2 stage, the idle clock periods are not actually used, so that according to the mechanism of FIG. 3-5, the idle clock periods can be used for the decimation operation.

The half decimation filter unit 122 still operates at the system clock (System Clk), and regarding the follow-up three decimation operations, $2^4=16$ clock periods 0-15 are taken as one time unit, which is shown as a fourth timing bar. Moreover, regarding the clock periods of the system clock relative to the second stage D2 out Clk, $2^2=4$ clock periods are used as one sub unit, which is shown as a third timing bar. In FIG. 4, I represents the real part output data, and Q represents the imaginary part output data. Numbers following behind I and Q represent 2-4 stage decimation operations. Further, DecF No is used for representing a cycle sequence in the half decimation filter unit 122.

In the present embodiment, according to the third timing bar, the clock period corresponding to a clock number 0 is used for processing and outputting data of I2. The clock period corresponding to a clock number 1 is used for processing and outputting data of Q2. The clock period corresponding to a clock number 3 is used for processing and outputting data of I3 and Q3. The clock period corresponding to a clock number 2 is used for processing and outputting data of I4 and Q4.

As described above, only one half decimation filter unit 122 is used to perform the follow-up three decimation operations D2-D4 by time-division. Further, desired output data is fedback to the half decimation filter unit 122 according to time-division, and the output is performed by time-division.

According to the same mechanism, a configuration of FIG. 6 is not unique, and the decimation operations can be integrated according to the number of the idle clock periods. In other words, $2^N$ clock periods are taken as one time unit to perform multiple decimation operations, wherein N≥2. In the present embodiment, N=4. The following tables 1-3 are embodiments of sequence plans of the three decimation operations performed during 16 clock periods.

TABLE 1

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 |   |   |   | I2 |   |   |   | I2 |   |    |    | I2 |    |    |    |
|   | Q2 |   |   |   | Q2 |   |   |   | Q2 |    |    |    | Q2 |    |    |
|   |   |   | I3 |   |   |   |   |   |   |    | I3 |    |    |    |    |
|   |   |   |   |   |   |   | Q3 |   |   |    |    |    |    |    | Q3 |
|   |   |   |   |   |   | I4 |   |   |   |    |    |    |    |    |    |
|   |   |   |   |   |   |   |   |   |   |    | Q4 |    |    |    |    |

TABLE 2

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 |   |   |   | I2 |   |   |   | I2 |   |    |    | I2 |    |    |    |
|   | Q2 |   |   |   | Q2 |   |   |   | Q2 |    |    |    | Q2 |    |    |
|   |   |   | I3 |   |   |   |   |   |   |    | I3 |    |    |    |    |
|   |   |   |   |   |   |   | Q3 |   |   |    |    |    |    |    | Q3 |
|   |   |   |   |   |   | I4 |   |   |   |    |    |    |    |    |    |
|   |   |   |   |   |   |   |   |   |   |    | Q4 |    |    |    |    |

TABLE 3

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 |   |   |   | I2 |   |   |   | I2 |   |    |    | I2 |    |    |    |
|   | Q2 |   |   |   | Q2 |   |   |   | Q2 |    |    |    | Q2 |    |    |
|   |   |   | I3 |   |   |   |   |   |   |    | I3 |    |    |    |    |
|   |   |   |   |   |   |   | Q3 |   |   |    |    |    |    |    | Q3 |
|   |   |   |   |   |   | I4 |   |   |   |    |    |    |    |    |    |
|   |   |   |   |   |   |   |   |   |   |    |    |    |    |    | Q4 |

Figure 7:
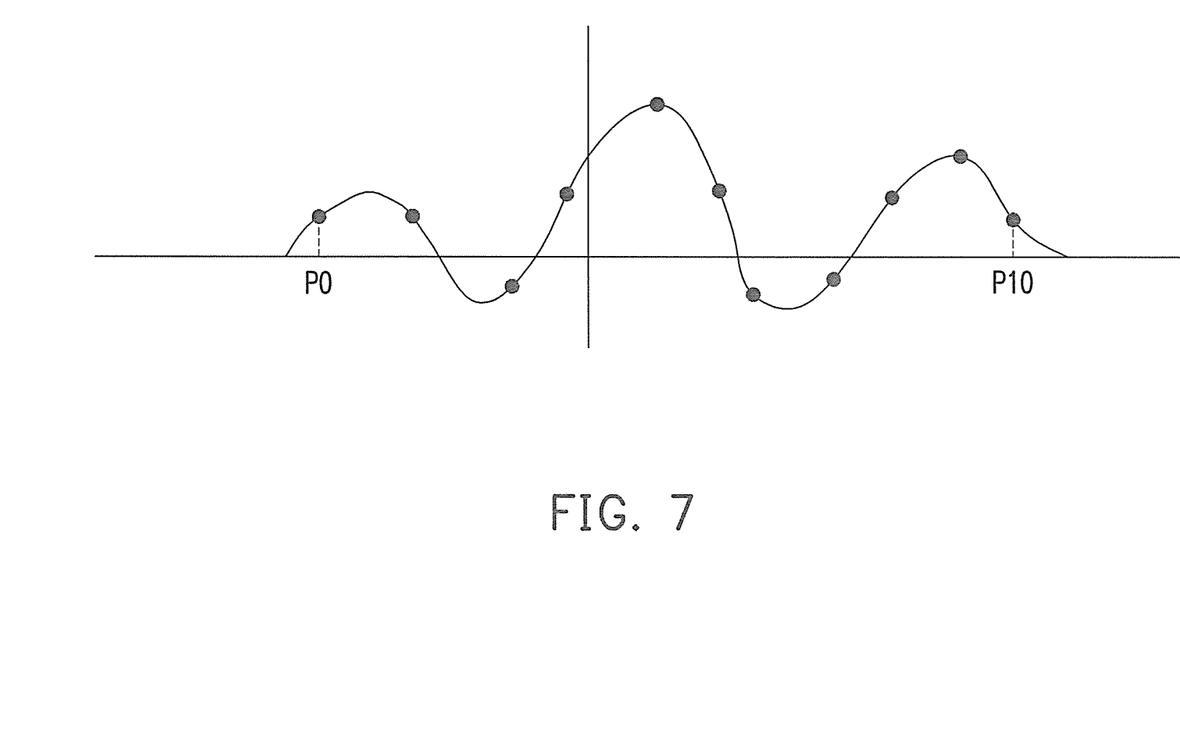
FIG. 7 illustrates a digital sampling data input to a half decimation filter unit.
Figure 8:
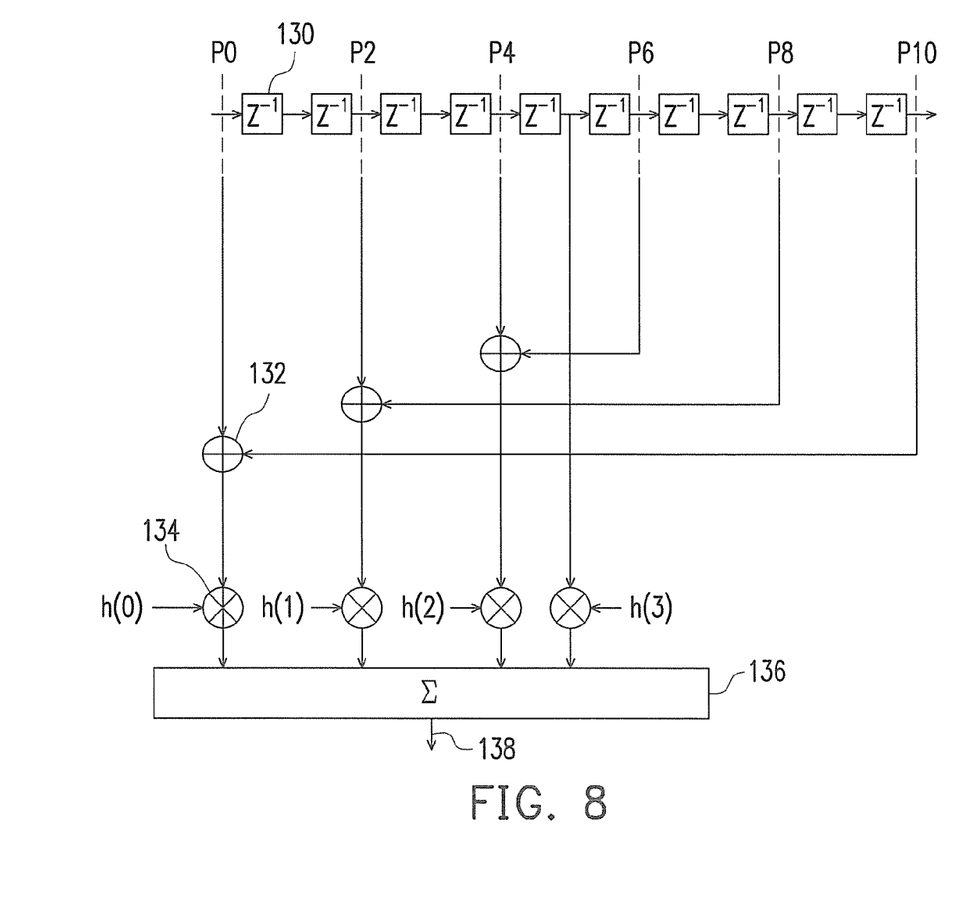
FIG. 8 is a circuit schematic diagram illustrating a half band filter (HBF) designed for sampling of FIG. 5.

Processing of an input analog signal performed by an actual circuit is described below. FIG. 7 illustrates a digital sampling data input to the half decimation filter unit. Referring to FIG. 7, the analog signal is sampled and digitalized according to fixed time intervals, and in accordance with a design of the HBF, the filtering operation is, for example, performed to 11 digital sampling points P0–P10. FIG. 8 is a circuit schematic diagram illustrating a HBF designed for sampling of FIG. 7. Referring to FIG. 8, 10 delayers 130 are set corresponding to the digital sampling points of FIG. 7, and each of the delayers 130 delays the signal for one clock period. After the input digital data are input by time-division, three output values of P0+P10, P2+P8, and P4+P6 are respectively obtained under functions of the delayers 130 and three adders 132, wherein data of P5 is individually output. Then, four multipliers 134 respectively multiply P0+P10, P2+P8, P4+P6 and P5 with predetermined ordinals h(0)-h(4). Then, a sum device 136 sums the four values to obtain an output data 138, which represents a value of Y of FIG. 5.

Figure 9:
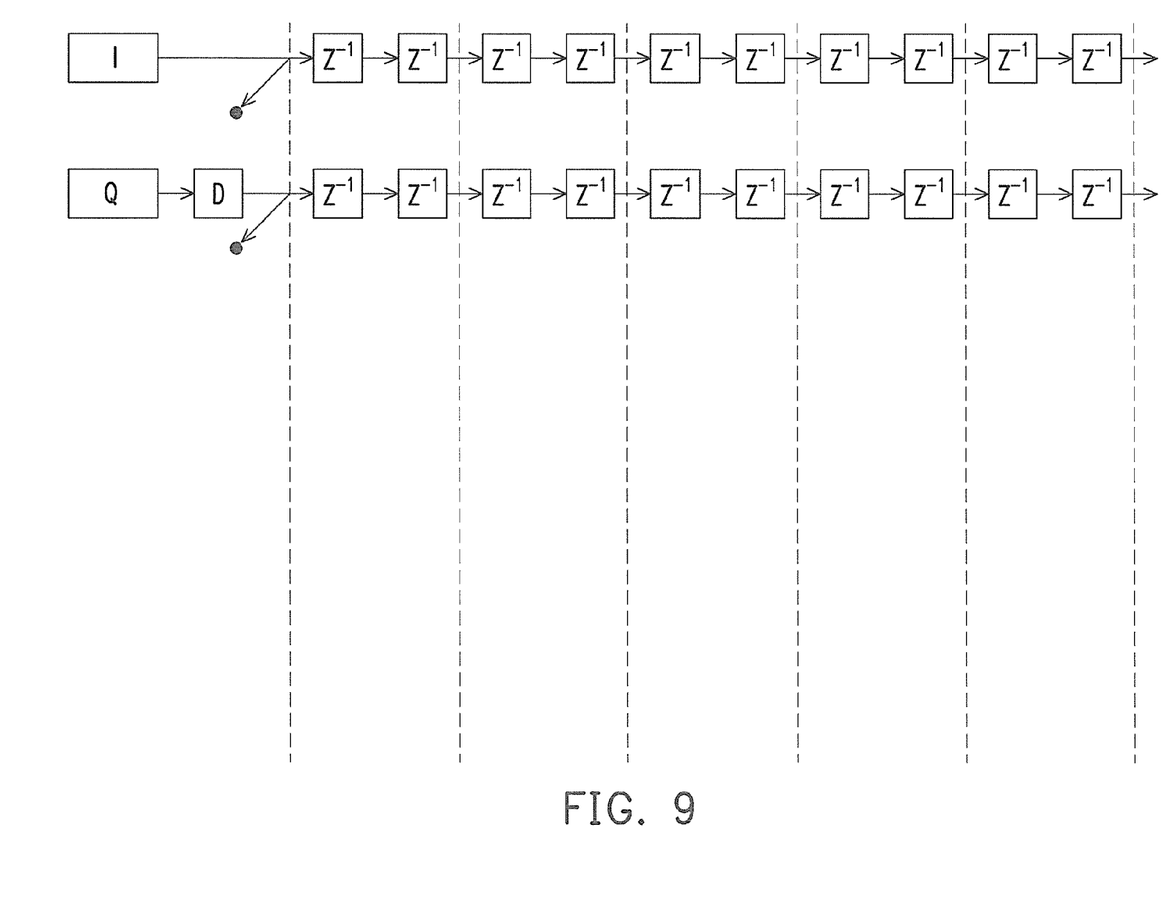
FIG. 9 is a schematic diagram illustrating a circuit operation mechanism of a half decimation filter unit.

FIG. 9 is a schematic diagram illustrating a circuit operation mechanism of a half decimation filter unit. Referring to FIG. 9, in accordance with the operation mechanism of FIG. 5, after the HBF of the half decimation filter unit receives data of the real part I, data of the imaginary part Q is delayed by a delayer D, and is input to the HBF of the half decimation filter unit. Wherein, dot lines represent that time-division multiplexing is used to select input positions of the adders. Then, the data to be reserved are selected from the output of the HBF for achieving the decimation effect but without actually needing decimator to perform decimation. This is because the odd data I and the even data Q are alternatively arranged to have the decimation effect. As a result, the first stage filtering and decimation operation is accomplished.

Figure 10:
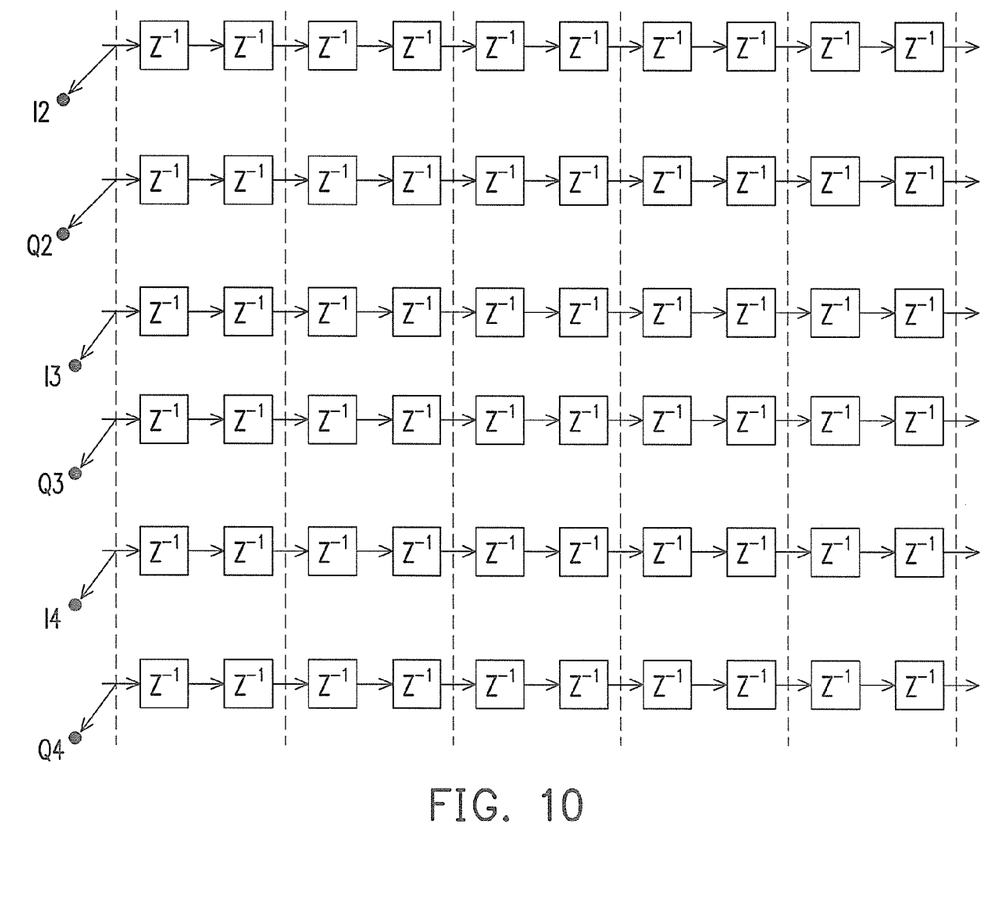
FIG. 10 is a schematic diagram illustrating an input/output mechanism of a half decimation filter unit during three filtering and decimation operations.

The follow-up three filtering and decimation operations can also be implemented by another half decimation filter unit. FIG. 10 is a schematic diagram illustrating an input/output mechanism of a half decimation filter unit during three filtering and decimation operations. Referring to FIG. 10, six strings of delayer corresponding to I2, Q2, I3, Q3, I4, Q4 are the same delayers in hardware, and only the input data and the input time points thereof are different. I2 and Q2 are input data used for the second stage filtering and decimation operation according to the output of I1 and Q1. I3 and Q3 are input data used for the third stage filtering and decimation operation according to the output of I2 and Q2. I4 and Q4 are input data used for the fourth stage filtering and decimation operation according to the output of I3 and Q3.

Figure 11:
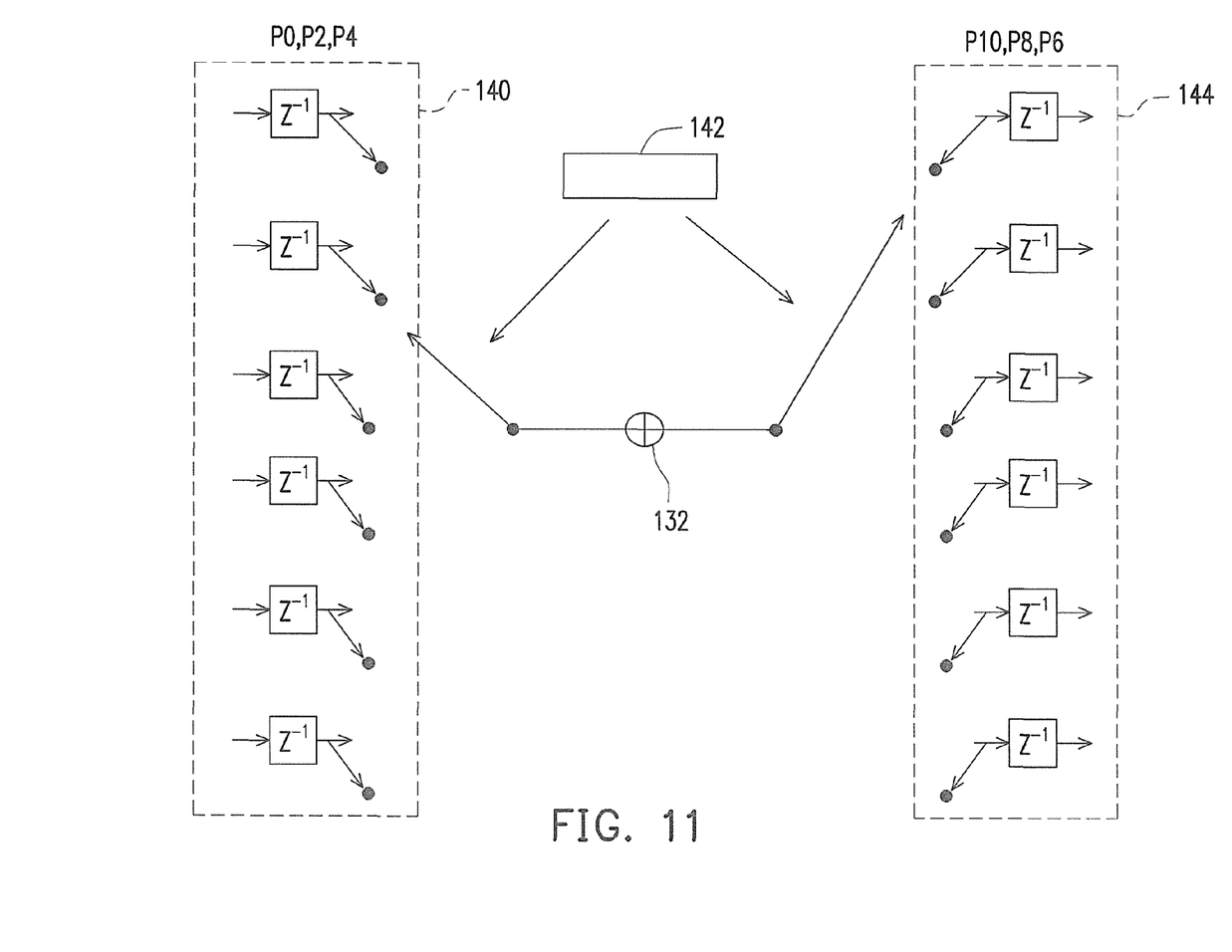
FIG. 11 is schematic diagram illustrating a mechanism of a time-division operation of FIG. 8 according to an embodiment of the present invention.

FIG. 11 is schematic diagram illustrating a mechanism of a time-division operation of FIG. 8 according to an embodiment of the present invention. Referring to FIG. 11, the three pairs of data of FIG. 10 further include six types of data I2, Q2, I3, Q3, I4 and Q4, and according to the timing diagram of FIG. 6, regarding the three adders 132 corresponding to P0+P10, P2+P8 and P4+P6, input of the adder 132 is switched by time-division. Selectors 140 and 144 are switched by time-division corresponding to the input time of I2, Q2, I3, Q3, I4 and Q4, which are controlled by a switching signal provided by a control unit 142.

Figure 12:
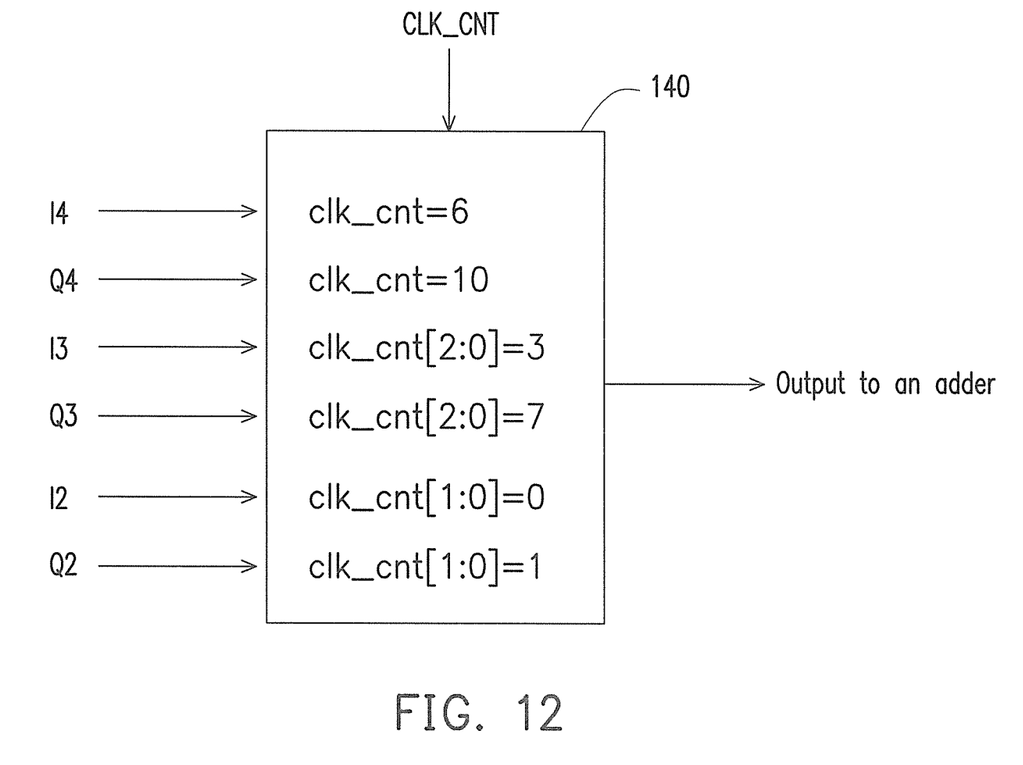
FIG. 12 is a schematic diagram illustrating a selection mechanism of a selector according to an embodiment of the present invention.

FIG. 12 is a schematic diagram illustrating a selection mechanism of a selector according to an embodiment of the present invention. Referring to FIG. 12, an operation mechanism of the selector 140 is taken as an example. According to a timing relationship shown in FIG. 6 or the table 2, the data of I2 is processed at the clock periods 0, 4, 8 and 12. The data of Q2 is processed at the clock periods 1, 5, 9 and 13. The data of I3 is processed at the clock periods 3 and 11. The data of Q3 is processed at the clock periods 7 and 15. The data of I4 is processed at the clock period 6. The data of Q4 is processed at the clock period 10. The corresponding data is selected by time-division according to a clock selecting signal CLK_CNT, and the selected data is output to the adder for the adding operation.

In this way, according to the time-division feedback processing and the time-division outputting of the second half decimation filter unit, the clock periods corresponding to the data abandoned during the decimation operation are used to perform the next stage filtering and decimation operations, so as to achieve the half decimation of three stages. Therefore, at least in case of the present embodiment, a 16-fold decimation effect originally achieved by using eight half decimation filter units in a conventional method now can be achieved by using two half decimation filter units.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A time-division (TD) decimation filter bank, comprising:

a half decimation filter unit, operated at a system clock for receiving an input data string, and taking $2^N$ clock periods as an operation-period unit for the half decimation filter unit, N=4, wherein the half decimation filter unit receives the input data string and receives a plurality of feedback data of the half decimation filter unit by TD, so as to distribute the received data into the $2^N$ clock periods for filtering and decimation and outputting by TD, wherein in the half decimation filter unit so that 16 clock periods are taken as the operation-period unit, wherein the 16 clock periods are respectively numbered as 0-15 shown in a following table, wherein I represents a first part data of each of the data, Q represents a second part data of each of the data, I2, Q2 represent an output of a second stage filtering and decimation operation, I3, Q3 represent an output of a third stage filtering and decimation operation, and I4, Q4 represent an output of a fourth stage filtering and decimation operation, and the table is:

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 |   |   |   | I2 |   |   |   | I2 |   |    |    | I2 |    |    |    |
|   | Q2 |   |   |   | Q2 |   |   |   | Q2 |   |    |    | Q2 |    |    |
|   |   |   | I3 |   |   |   |   |   |   |    | I3 |    |    |    |    |
|   |   |   |   |   |   |   | Q3 |   |   |    |    |    |    |    | Q3 |
|   |   |   |   |   |   | I4 |   |   |   |    |    |    |    |    |    |
|   |   |   |   |   |   |   |   |   |   | Q4 |    |    |    |    |    | or

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 |   |   |   | I2 |   |   |   | I2 |   |    |    | I2 |    |    |    |
|   | Q2 |   |   |   | Q2 |   |   |   | Q2 |   |    |    | Q2 |    |    |
|   |   |   | I3 |   |   |   |   |   |   |    | I3 |    |    |    |    |
|   |   |   |   |   |   |   | Q3 |   |   |    |    |    |    |    | Q3 |
|   |   |   |   |   |   | I4 |   |   |   |    |    |    |    |    |    |
|   |   |   |   |   |   |   |   |   |   | Q4 |    |    |    |    |    | or

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 |   |   |   | I2 |   |   |   | I2 |   |    |    | I2 |    |    |    |
|   | Q2 |   |   |   | Q2 |   |   |   | Q2 |   |    |    | Q2 |    |    |
|   |   |   | I3 |   |   |   |   |   |   |    | I3 |    |    |    |    |
|   |   |   |   |   |   |   | Q3 |   |   |    |    |    |    |    | Q3 |
|   |   |   |   |   |   | I4 |   |   |   |    |    |    |    |    |    |
|   |   |   |   |   |   |   |   |   |   |    |    |    |    |    | Q4 . |

2. A time-division (TD) decimation filter bank, comprising:
  a first half decimation filter unit, operated at a system clock for receiving a first-stage input data string, wherein each data in the first-stage input data string comprises a first part data and second part data, during each odd clock period of the system clock, the first part data is filtered and decimated by half in frequency for outputting, and during each even clock period, the second part data is filtered and decimated by half in frequency for outputting; and
  a second half decimation filter unit, operated at the system clock, and taking $2_N$ clock periods as an operation-period unit for the second half decimation filter unit, $N \geq 2$ and is an integer, wherein the second half decimation filter unit receives an output of the first half decimation filter unit and receives a plurality of feedback data of the second half decimation filter unit by TD, so as to distribute the received data into the $2^N$ clock periods for filtering and decimation and outputting by TD.

3. The TD decimation filter bank as claimed in claim 2, wherein in the second half decimation filter unit, N=4, so that 16 clock periods are taken as the operation-period unit, wherein the 16 clock periods are respectively numbered as 0-15 shown in a following table, wherein I represents a first part data of each of the data, Q represents a second part data of each of the data, I2, Q2 represent an output of a second stage filtering and decimation operation, I3, Q3 represent an output of a third stage filtering and decimation operation, and I4, Q4 represent an output of a fourth stage filtering and decimation operation, and the table is:

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 |    |    |    | I2 |    |    |    | I2 |    |    |    | I2 |    |    |    |
|    | Q2 |    |    |    | Q2 |    |    |    | Q2 |    |    |    | Q2 |    |    |
|    |    | I3 |    |    |    |    |    |    |    | I3 |    |    |    |    |    |
|    |    |    |    |    |    | Q3 |    |    |    |    |    |    |    | Q3 |    |
|    |    |    |    |    |    |    | I4 |    |    |    |    |    |    |    |    |
|    |    |    |    |    |    |    |    |    |    |    |    |    |    |    | Q4 | or

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 |    |    |    | I2 |    |    |    | I2 |    |    |    | I2 |    |    |    |
|    | Q2 |    |    |    | Q2 |    |    |    | Q2 |    |    |    | Q2 |    |    |
|    |    | I3 |    |    |    |    |    |    |    | I3 |    |    |    |    |    |
|    |    |    |    |    |    |    |    |    | Q3 |    |    |    |    |    | Q3 |
|    |    |    |    |    |    | I4 |    |    |    |    |    |    |    |    |    |
|    |    |    |    |    |    |    |    |    |    |    |    | Q4 |    |    |    | or

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 |    |    |    | I2 |    |    |    | I2 |    |    |    | I2 |    |    |    |
|    | Q2 |    |    |    | Q2 |    |    |    | Q2 |    |    |    | Q2 |    |    |
|    |    | I3 |    |    |    |    |    |    |    | I3 |    |    |    |    |    |
|    |    |    |    |    |    | Q3 |    |    |    |    |    |    |    | Q3 |    |
|    |    |    |    | I4 |    |    |    |    |    |    |    |    |    |    |    |
|    |    |    |    |    |    |    |    |    |    |    |    |    |    |    | Q4 . |

4. The TD decimation filter bank as claimed in claim 2, wherein the first part data and the second part data are respectively a real part data and an imaginary part data of each of the data.

5. The TD decimation filter bank as claimed in claim 2, the second half decimation filter unit further comprises a time-division multiplexer for selecting an output of the second half decimation filter unit according to a predetermined time sequence.

6. The TD decimation filter bank as claimed in claim 2, wherein each of the first half decimation filter unit and the second half decimation filter unit comprises a half band filter (HBF).

7. The TD decimation filter bank as claimed in claim 2, wherein after the first half decimation filter unit completes the first stage filter and decimation operation, the second half decimation filter unit uses idle clocks periods of the first half decimation filter unit to perform three stages of filtering and decimation operations of follow-up cycles.

8. A time-division (TD) decimation filtering method, comprising:
  using a first half decimation filter unit operated under a system clock to receive a first-stage input data string, wherein each data in the first-stage input data string comprises a first part data and a second part data, during each odd clock period of the system clock, the first part data is filtered and decimated by half in frequency for outputting, and during each even clock period, the second part data is filtered and decimated by half in frequency for outputting; and
  using a second half decimation filter unit to operate under the system clock, and taking $2^N$ clock periods as an operation-period unit for the second half decimation filter unit, $N \geq 2$ and is an integer, wherein the second half decimation filter unit receives an output of the first half decimation filter unit and receives a plurality of feedback data of the second half decimation filter unit by TD, so as to distribute the received data into the $2^N$ clock periods for filtering and decimation and outputting by TD.

9. The TD decimation filtering method as claimed in claim 8, wherein in the second half decimation filter unit, N=4, so that 16 clock periods are taken as the operation-period unit, wherein the 16 clock periods are respectively numbered as 0-15 shown in a following table, wherein I represents a first part data of each of the data, Q represents a second part data of each of the data, I2, Q2 represent an output of a second stage filtering and decimation operation, I3, Q3 represent an output of a third stage filtering and decimation operation, and I4, Q4 represent an output of a fourth stage filtering and decimation operation,
  wherein the second half decimation and filter unit performs the second stage filtering and decimation operation, the third stage filtering and decimation operation and the fourth stage filtering and decimation operation according to a timing of the table, and the table is:

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 | Q2 | I3 |  | I2 | Q2 | Q3 | I4 | I2 | Q2 | I3 | Q4 | I2 | Q2 | Q3 |  | or

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 | Q2 |  | I3 | I2 | Q2 | Q3 | I4 | I2 | Q2 | I3 | Q4 | I2 | Q2 |  | Q3 | or

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| I2 | Q2 |  | I3 | I2 | Q2 | I4 | Q3 | I2 | Q2 | I3 |  | I2 | Q2 | Q3 | Q4 |

\* \* \* \* \*